United States Patent
Schulze et al.

(10) Patent No.: US 8,883,612 B2
(45) Date of Patent: Nov. 11, 2014

(54) METHOD FOR MANUFACTURING A SEMICONDUCTOR DEVICE

(75) Inventors: Hans-Joachim Schulze, Taufkirchen (DE); Francisco Javier Santos Rodriguez, Villach (AT); Anton Mauder, Kolbermoor (DE); Johannes Baumgartl, Riegersdorf (AT); Carsten Ahrens, Pettendorf (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/229,861

(22) Filed: Sep. 12, 2011

(65) Prior Publication Data

US 2013/0065379 A1    Mar. 14, 2013

(51) Int. Cl.
| | | |
|---|---|---|
| H01L 21/00 | (2006.01) | |
| H01L 21/02 | (2006.01) | |
| H01L 21/324 | (2006.01) | |
| H01L 21/265 | (2006.01) | |
| H01L 29/16 | (2006.01) | |

(52) U.S. Cl.
CPC ...... *H01L 21/3247* (2013.01); *H01L 21/02505* (2013.01); *H01L 29/1608* (2013.01); *H01L 21/26506* (2013.01); *H01L 21/02513* (2013.01); *H01L 21/02664* (2013.01); *H01L 21/02378* (2013.01); *H01L 21/02381* (2013.01)
USPC .................... 438/455; 438/137; 257/E21.601

(58) Field of Classification Search
None
See application file for complete search history.

(56) References Cited

U.S. PATENT DOCUMENTS

| | | | | |
|---|---|---|---|---|
| 5,854,123 | A * | 12/1998 | Sato et al. ...................... | 438/507 |
| 6,020,250 | A * | 2/2000 | Kenney ......................... | 438/422 |
| 6,107,213 | A * | 8/2000 | Tayanaka ....................... | 438/762 |
| 6,191,007 | B1 * | 2/2001 | Matsui et al. .................. | 438/459 |
| 6,246,068 | B1 * | 6/2001 | Sato et al. ......................... | 257/3 |
| 6,306,729 | B1 * | 10/2001 | Sakaguchi et al. ............ | 438/458 |
| 6,350,945 | B1 * | 2/2002 | Mizuno .......................... | 136/246 |
| 6,426,235 | B1 * | 7/2002 | Matsushita et al. ............. | 438/22 |
| 6,429,095 | B1 * | 8/2002 | Sakaguchi et al. ............ | 438/458 |
| 6,534,380 | B1 * | 3/2003 | Yamauchi et al. ............ | 438/455 |
| 6,677,183 | B2 * | 1/2004 | Sakaguchi et al. ............ | 438/113 |
| 6,972,215 | B2 * | 12/2005 | Sakaguchi et al. ............ | 438/113 |
| 7,153,761 | B1 * | 12/2006 | Nastasi et al. ................. | 438/475 |
| 7,157,352 | B2 * | 1/2007 | Yamanaka ..................... | 438/458 |

(Continued)

FOREIGN PATENT DOCUMENTS

WO    2011017693 A1    2/2011

OTHER PUBLICATIONS

Defect nucleation in SOI wafers due to hydrogen ion implantation M. Xu, X.Q. Feng *Key Lab of Failure Mechanics of Education Ministry, Department of Engineering Mechanics, Tsinghua University, Beijing 100084, China Available online Nov. 5, 2004.*

(Continued)

*Primary Examiner* — Charles Garber
*Assistant Examiner* — Evren Seven
(74) *Attorney, Agent, or Firm* — Murphy, Bilak & Homiller, PLLC

(57) ABSTRACT

A method of manufacturing a semiconductor device includes forming a porous area of a semiconductor body. The semiconductor body includes a porous structure in the porous area. A semiconductor layer is formed on the porous area. Semiconductor regions are formed in the semiconductor layer. Then, the semiconductor layer is separated from the semiconductor body along the porous area, including introducing hydrogen into the porous area by a thermal treatment.

16 Claims, 4 Drawing Sheets

(56) References Cited

U.S. PATENT DOCUMENTS

| | | | |
|---|---|---|---|
| 7,276,429 B2* | 10/2007 | Yamanaka | 438/455 |
| 7,521,335 B2* | 4/2009 | Yamanaka | 438/458 |
| 7,524,736 B2* | 4/2009 | Ottaviani et al. | 438/455 |
| 7,622,363 B2* | 11/2009 | Yonehara et al. | 438/458 |
| 2009/0162992 A1* | 6/2009 | Kato et al. | 438/455 |
| 2009/0233079 A1* | 9/2009 | Bedell et al. | 428/310.5 |
| 2012/0083098 A1* | 4/2012 | Berger et al. | 438/458 |
| 2013/0240030 A1* | 9/2013 | Masolin et al. | 136/256 |

OTHER PUBLICATIONS

Lehmann, Volker, "The Electrochemical Dissolution of Silicon", Electrochemistry of Silicon: Instrumentation, Science, Materials and Applications, 2002, pp. 50-75, Wiley-VCH Verlag GmbH, Weinheim, Germany.

Armbruster, S., Micromachining of Monocrystalline Silicon Membranes for Sensor Applications Using Porous Silicon, 2005, pp. 20-25 & pp. 96-101, IMTEK, University Freiburg, Germany.

Berge, C. "Separation Layers from Sintering of Porous Silicon: Layer Formation and Applications", 2005, excerpt from Dissertation, Shaker Verlag, Aachen, Germany.

Yonehara, T. et al. "ELTRAN; Novel SOI Wafer Technology" JSAP International No. 4, Jul. 2001, pp. 10-16, Japan.

Armbruster, S., "Porous Silicon for MEMS Sensors and beyond", online slide show presented by Robert Bosch GmbH, Oct. 8, 2008, available online at https://wesrch1.wesrch.com/User_images/Pdf/WS10GBL_1228149298_5.pdf.

* cited by examiner

METHOD FOR MANUFACTURING A SEMICONDUCTOR DEVICE

BACKGROUND

For a plurality of applications of electronic semiconductor devices and integrated circuits (IC) it is advantageous to limit the overall thickness of the semiconductor device and the integrated circuits, respectively. For example, low weight and small dimensions are relevant for chip cards and smartcards. Likewise, the electrical properties of devices such as vertical power semiconductor elements can be improved by specific adjustment of the thickness of the semiconductor body. By matching the thickness of the semiconductor body to the voltage class of the respective power semiconductor element, unwanted electric resistance of oversized semiconductor bodies may be prevented.

Thus, a precise and reliable adjustment of a thickness of a semiconductor body is desirable to avoid losses in the yield of manufacturing and to assure reliable electrical characteristics of semiconductor devices and integrated circuits, respectively.

SUMMARY

According to one embodiment of a method of manufacturing a semiconductor device, the method includes forming a porous area at a surface of a semiconductor body. The semiconductor body includes a porous structure in the porous area. The method further includes forming a semiconductor layer on the porous area, and forming semiconductor regions in the semiconductor layer. The method further includes separating the semiconductor layer from the semiconductor body along the porous area. Separating the semiconductor layer from the semiconductor body includes introducing hydrogen into the porous area by a thermal treatment.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in 25 which the invention may be practiced. In this regard, directional terminology, such as "top", "bottom", "front", "back", "leading", "trailing", "over", "above", "below", etc., is used with reference to the orientation of the Figure(s) being described. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or semiconductor body. This can be for instance the surface of a wafer or a die. The term "vertical" as used in this specification intends to describe an orientation which is arranged perpendicular to the first surface of the semiconductor substrate or semiconductor body.

In the following, exemplary embodiments are explained with reference to the Figures. The invention is, however, not limited to the embodiments which are described in detail, but can be modified and varied in appropriate ways. Particular features and combination of features of an embodiment can be appropriately combined with features and combinations of features of another embodiment, as far as this is not explicitly excluded.

FIGS. 1A to 1D illustrate schematic views of cross sections of a semiconductor device during different phases of a manufacturing method.

Figure 1A:
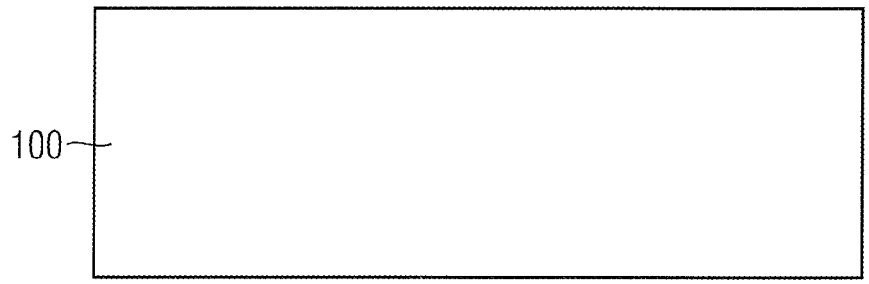
FIGS. 1A to 1E illustrate schematic views of cross sections of a semiconductor body to which the manufacturing method according to an embodiment is applied.

The schematic cross section of FIG. 1A illustrates a semiconductor body 100. According to one embodiment, the semiconductor body 100 includes or is made of silicon (Si). According to another embodiment, the semiconductor body 100 includes or is made of silicon carbide (SiC). Typically, Si and SiC semiconductor bodies are made of single crystalline material, but the semiconductor body may also include polycrystalline or amorphous material parts.

Figure 1B:
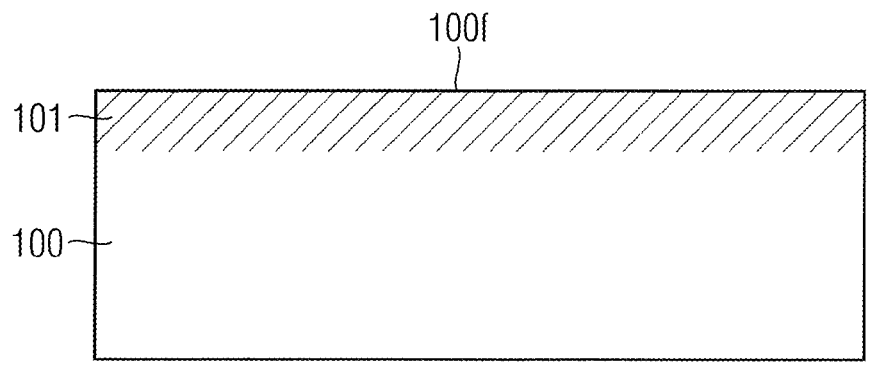

Referring to the schematic cross section of FIG. 1B, a porous area 101 is formed at a first surface of the semiconductor body 100 by altering the crystal structure of the semiconductor body 100 at the first surface from e.g. a single- or multi-crystalline structure into a porous structure. Then, the semiconductor body 100 includes a porous structure in the porous area 101. The porous structure in the porous area 101 can be manufactured by anodic oxidation of Si or SiC using one or more solution(s) containing fluoride (F). As an example, a solution containing hydrofluoric acid (HF) and ethanol or acetic acid is used. Also other solutions which are configured to alter the crystal structure to a porous structure can be employed (e.g. HF/Dimethylformamide, HF/acenitrile, etc.) optionally using or avoiding an external light source.

Upon physical contact of the solution and the semiconductor body 100, a reaction occurs which causes the semiconductor body 100 to alter its structure into a porous structure. This reaction as well as the respective effect begins at the surface of the semiconductor body 100 and propagates into the semiconductor body 100. Hence, the solution is typically applied from a front surface 100f of the semiconductor body 100. The porosity of the porous area can be controlled by choosing proper values for parameters such as current density and HF concentration in the solution.

The porous structure of the porous area 101 includes a plurality of cavities such as meso-pores and/or nano-pores. Typical pore sizes for nano-pores are below approximately 2 nm, meso-pores have 2 nm up to approximately 100 nm pore size and macro-pores can have sizes in the µm range. Porosities of up to or more than 70% may be achieved. According to an embodiment, the porosity at the surface is kept small enough so as to allow appropriate growth of further layers on the porous area 101.

However, such further layers may also be grown on a porous area 101 with pores including dimensions in the nm up to µm range, e.g. nano-pores, meso-pores or even macro-pores. In this case, a high temperature TCS (trichlorosilane) epitaxial growth process with temperatures in the range of 1050° C. up to 1230° C. or in the range of 1150° C. up to 1200° C. may be employed for growing a further layer on the porous area 101.

Figure 1C:
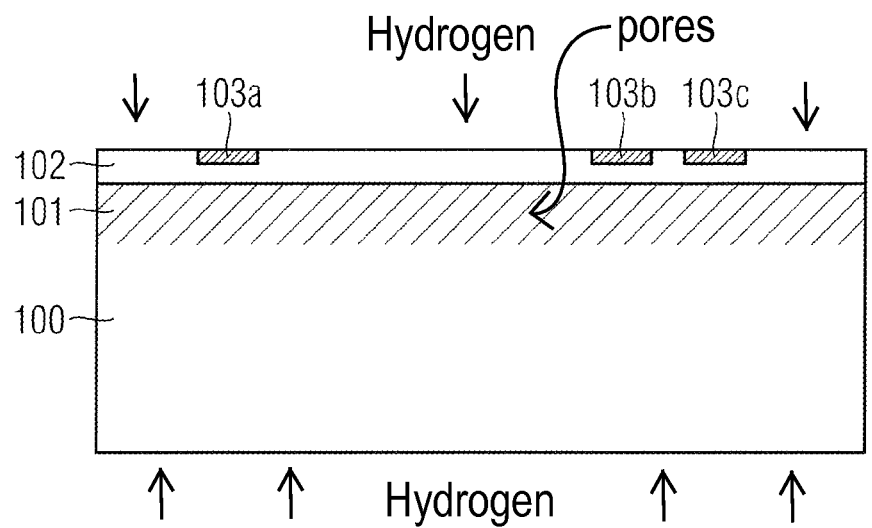

After forming the porous area 101, and as illustrated in the schematic cross section of FIG. 1C, a semiconductor layer 102 is formed on the porous area 101. The semiconductor layer 102 corresponds to a further layer to be arranged on the porous area 101 as described above, and is for example grown or deposited on the porous area 101 having the porous structure. Typically, the semiconductor layer 102 is formed by epitaxial growth so as to have a desired thickness. According to an embodiment, the semiconductor layer 102 is formed so as to have a thickness in a range of 5 µm to 200 µm, or in a range of 20 µm to 170 µm or in a range of 35 µm to 150 µm.

Then, regions 103a, 103b, 103c are formed in the semiconductor layer 102, so as to form functional elements. As an example the regions 103a, 103b, 103c may include semiconductor regions formed by ion implantation and/or diffusion of impurities into the semiconductor layer 102. The semiconductor regions may be formed by different lithographic steps, for example. The semiconductor regions may include n-type, p-type or a combination of n-type and p-type regions. Examples for the semiconductor regions include source, drain, body, emitter, base, and/or collector regions. The regions 103a, 103b, 103c may also include dielectric and conductive materials on or close to the surface of the semiconductor regions including a planar gate dielectric and a planar gate electrode. The regions 103a, 103b, 103c may also include trench structures including dielectric and conductive materials therein, e.g. a trench including a gate dielectric and a gate electrode. The regions 103a, 103b and 103c may include electrical and/or micromechanical elements formed in the semiconductor layer 102. Accordingly, a plurality of processes can be applied for forming the regions 103a, 103b, 103c in the semiconductor layer 102, such as etching, application of laser light, doping, polishing, material deposition or growth, and other treatments, and in particular also various combinations of such processes. For example, regions 103 of the semiconductor layer 102 can be appropriately doped so as to achieve desired doping concentrations for a respective desired functions of a semiconductor device.

Figure 1D:
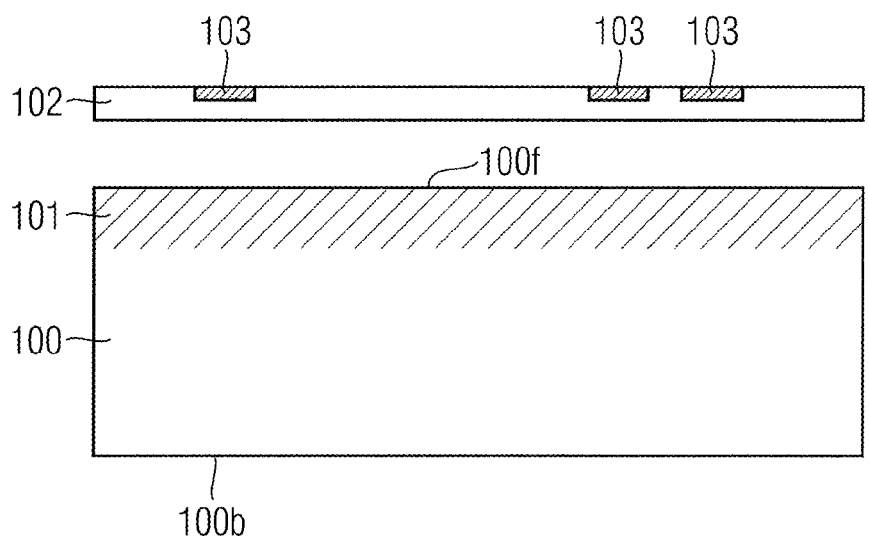

Then, as illustrated in the cross section of FIG. 1D, the semiconductor layer 102 is separated from the semiconductor body 100 along the porous area 101. Separating the semiconductor layer 102 from the semiconductor body 100 includes introducing hydrogen into the porous area 101 of the semiconductor body 100 by a thermal treatment.

In particular, introducing hydrogen into the porous area 101 can also come along with introducing hydrogen into the overall semiconductor body 100, as long as the introduced hydrogen is applied to the porous area 101. Therefore, the hydrogen to be introduced into the porous area 101 can for example be applied from a rear side 100b of the semiconductor body 100. Alternatively, or in addition to introducing hydrogen from the rear side 102b, hydrogen is introduced from the front surface 100f of the semiconductor body 100, which means from or through the semiconductor layer 102 to be separated. A thermal treatment supports introduction of hydrogen into the porous area 101 by e.g. enhanced diffusion. Furthermore, a thermal treatment of semiconductor material adjacent to a hydrogen containing atmosphere which is then present in the pores can lead to an increased surface mobility of the semiconductor atoms and thus to an easier re-arrangement or reallocation of the semiconductor atoms.

When the hydrogen is introduced into the porous area 101, respective pores of the porous structure in the porous area 101 are reallocated, i.e. rearranged in such way, that cavities are arranged along a level of the semiconductor body 100 and the semiconductor body 100 is separated from the semiconductor layer 102 along the porous area 101.

The hydrogen can be introduced into or near the porous area 101 by way of diffusion, for example. However, it is also possible to implant hydrogen into the porous area 101. Also a combination of diffusing hydrogen into the semiconductor body 100 and implanting hydrogen into the semiconductor body 100 may be used.

When the hydrogen is introduced into the porous area 101 by way of ion-implantation, an implant dose of hydrogen can for example be lower than $10^{16}$ cm$^{-2}$, e.g. in a range of $5 \cdot 10^{14}$ cm$^{-2}$ to $5 \cdot 10^{16}$ cm$^{-2}$. Moreover, the energy can for example be in the range of 150 keV to 4 MeV.

Moreover, forming the porous area 101 of the semiconductor body can include—in particular partial—anodic dissolution of the semiconductor body 100.

As already described above, meso-pores, i.e. pores with an average size between approximately 2 nm and approximately 100 nm may be advantageous, since they come along with smaller Si or SiC structures around the actual pores. This allows an easier separation of the semiconductor layer 102 from the semiconductor body 100 due to a higher surface mobility of the Si atoms and/or C atoms and/or formation of volatile C—H compounds, respectively, as well as higher radii of curvature and a larger overall surface area in the separation volume. These effects and benefits can also be achieved with porosities including pore sizes in the range of nm or sub-nm, i.e. nano-pores.

When hydrogen is introduced into the porous area 101, a relocation of Si or SiC, respectively, takes place, which is thermally activated. The relocation is also further supported by the hydrogen introduced into the porous area 101 and corresponds to a reduction of the surface area quantity in the porous area 101, causing actual cavities to be generated. By further increasing the Si or SiC mobility in the porous area 101, besides the separation of the semiconductor layer 102 from the semiconductor body 100, also a levelling of the latter can be achieved.

This means that in case parts of the porous area 101 will adhere to the semiconductor layer 102 after its separation from the semiconductor body 100, these parts do not have to be removed by etching or polishing, because such parts may have a negligible thickness and are already smoothed. Hence, as the semiconductor layer 102 is not subject to further etching or polishing processes after the separation from the semiconductor body 100, the semiconductor layer 102 can be realized having a very small thickness. However, typical rear side processing such as ion implantation or laser annealing can be applied to the separated semiconductor body 102 without difficulty.

The above described separation process of the semiconductor layer 102 that may have undergone processing of devices and wiring at the front surface leads to a semiconductor device having a precisely adjusted thickness of its semiconductor body. The variation of the thickness over the semiconductor body is small and may be smaller than 10%, smaller than 8%, smaller than 4% or even smaller than 2% of the total thickness of the semiconductor body to assure reliable electrical characteristics of semiconductor devices and integrated circuits formed therein, respectively.

Figure 1E:
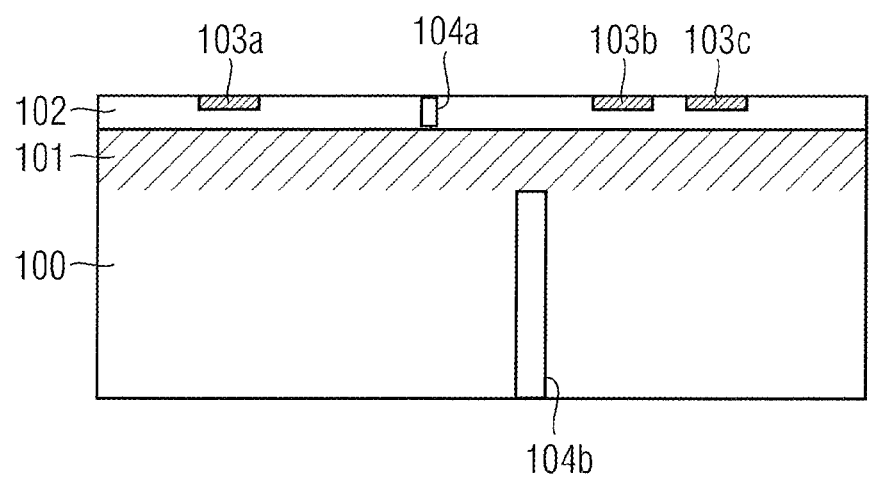

In the schematic cross section of FIG. 1E, a semiconductor body 100, a porous area 101, a semiconductor layer 102, and regions 103a, 103b, 103c in the semiconductor layer 102 similar to FIGS. 1C and 1D are illustrated. Moreover, trenches 104a and 104b are illustrated, which are provided in order to facilitate the application of hydrogen to the porous structure. The trenches 104a and 104b can be provided alternatively or in arbitrary combinations and number and may include trench side walls having no or different degrees of taper.

Trench 104a is formed in the semiconductor layer 102 and may extend through the semiconductor layer 102 to the porous area 101 or end within the semiconductor layer 102. Trench 104a facilitates the application of hydrogen to the porous area 101 because the hydrogen can more easily reach the porous area 101.

Alternatively or in addition to the trench 104a a trench 104b is provided at the reverse side of the semiconductor body 100. Trench 104b can also extended up to the porous area 101 or end within the semiconductor body 100 before reaching the porous area 101. Again, trench 104b facilitates the application of hydrogen to the porous area 101 because the hydrogen can more easily reach the porous area 101. While trench 104a may be formed after forming the semiconductor layer 102 on the semiconductor body 100, trench 104b may be formed before or after forming the semiconductor layer 102 on the semiconductor body 100.

According to another embodiment, forming the porous area 101 includes forming a double porosity structure including a first porous area having a first porosity and a second porous area deeper within the semiconductor body 100 having a second porosity. The porosity of the porous areas can be controlled by choosing proper values for parameters such as current density and/or HF concentration in the solution and/or intensity of light irradiation.

According to an embodiment, the first porosity is set to be smaller than the second porosity. This is for example illustrated in FIG. 2A, where a first porous area 101a is formed in the semiconductor body 100, and a second porous area 101b is also formed below the first porous area 101a, i.e. deeper in the semiconductor body 100. As an example, a porosity of the first porous area 101a is set in a range between 10% and 50% and the porosity of the second porous area 101b is set in a range between the porosity of the first porous area 101a and 80%. Selecting the first porosity smaller than the second porosity allows to improve the crystal quality of a semiconductor layer 102 grown on the first porous area 101a by adjusting the first porosity and to improve separation of the semiconductor layer 102 from the semiconductor body 100 by adjusting the second porosity in the second porous area 101b.

Figure 2A:
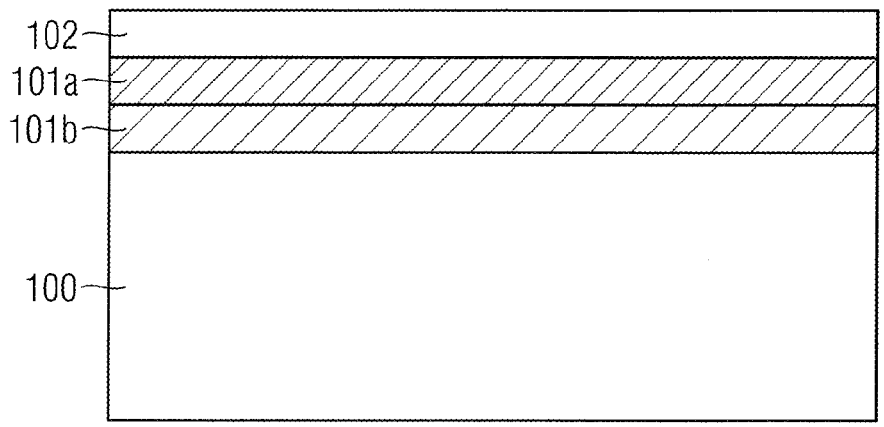
FIGS. 2A and 2B illustrate schematic views of cross sections of semiconductor bodies, which are subject to manufacturing methods according to embodiments.
Figure 2B:
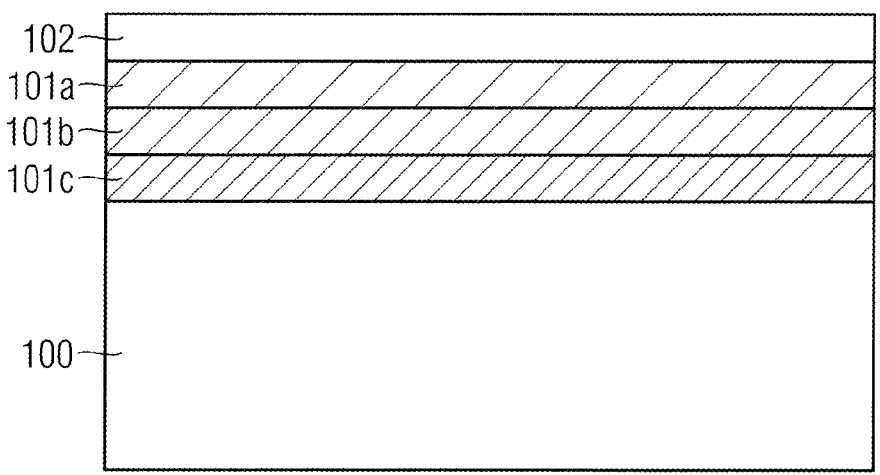

FIG. 2B illustrates yet another embodiment including, in addition the embodiment illustrated in FIG. 2A, a third porous area 101c that is arranged deeper within the semiconductor body 100 with respect to both the first and the second porous areas 101a and 101b. Accordingly, the porosity of the first porous area 101a is set smaller than the porosity of the second and the third porous areas 101b and 101c. Also, the third porous area 101c has the largest porosity of the three porous areas 101a, 101a, and 101c.

It is to be understood that the features of the various embodiments described herein may be combined with each other, unless specifically noted otherwise. Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
    forming vertical semiconductor elements extending between a front surface and a rear side of a semiconductor layer by:
    forming a porous area at a surface of a semiconductor body, wherein the semiconductor body includes a porous structure in the porous area;
    forming the semiconductor layer on the porous area by epitaxial growth so as to have a thickness in a range of 5 µm to 200 µm;
    forming semiconductor regions including source, body, emitter, base and/or collector regions in a front surface of the semiconductor layer by ion implantation;
    introducing, after forming the semiconductor regions, hydrogen into the porous area by a thermal treatment, thereby activating a reallocation of pores and causing cavities to be generated, so that the semiconductor layer with the semiconductor regions is separated from the semiconductor body along the porous area; and
    applying, after separation of the semiconductor layer, rear side processing to the semiconductor layer,
    wherein the rear side processing comprises ion implantation.

2. The method of claim 1, wherein the hydrogen is introduced into the porous area by diffusion of the hydrogen through the semiconductor layer into the porous area.

3. The method of claim 1, wherein the semiconductor body is one of Si and SiC.

4. The method of claim 1, wherein forming the porous area of the semiconductor body comprises anodic dissolution of the semiconductor body.

5. The method of claim 4, wherein the anodic dissolution of the semiconductor body comprises anodic dissolution of silicon in a chemical mixture of hydrofluoric acid and ethanol or acetic acid.

6. The method claim 4, wherein forming the porous area comprises forming a double porosity structure including a first porous area in the semiconductor body which has a first porosity and a second porous area deeper within the semiconductor body which has a second porosity, wherein the first porosity is smaller than the second porosity.

7. The method of claim 6, wherein the porosity of the first porous area is set in a range between 10% and 50% and the porosity of the second porous area is set in a range between the porosity of the first porous area and 80%.

8. The method of claim 1, wherein forming the semiconductor regions in the semiconductor layer comprises forming at least one of n-type and p-type regions in the semiconductor layer by introducing impurities into the semiconductor layer.

9. The method of claim 1, further comprising forming a trench in at least one of the semiconductor body and in the semiconductor layer.

10. A method of manufacturing a semiconductor device, comprising:
   forming vertical semiconductor elements extending between a front surface and a rear side of a semiconductor layer by:
   forming a porous area at a surface of a semiconductor body, wherein the semiconductor body includes a porous structure in the porous area;
   forming semiconductor layer on the porous area by epitaxial growth so as to have a thickness in a range of 5 μm to 200 μm;
   forming semiconductor regions in the semiconductor layer including source, body, emitter, base and/or collector regions by ion implantation in a front side of the semiconductor layer;
   introducing, after forming the semiconductor regions, hydrogen into the porous area by ion-implantation, thereby activating a reallocation of pores and causing cavities to be generated, so that the semiconductor layer with the semiconductor regions is separated from the semiconductor body along the porous area; and
   applying, after separation of the semiconductor layer rear side processing to the semiconductor layer,
   wherein the rear side processing comprises ion implantation.

11. The method of claim 10, wherein an implant dose of the hydrogen is in a range of $5 \cdot 10^{14}$ cm$^{-2}$ to $5 \cdot 10^{15}$ cm$^{-2}$.

12. The method of claim 10, wherein an implant energy of the ion implantation is in the range of 150 keV to 4 MeV.

13. The method of claim 10, wherein forming the porous area of the semiconductor body comprises anodic dissolution of the semiconductor body.

14. The method of claim 13, wherein the anodic dissolution of the semiconductor body comprises anodic dissolution of silicon in a chemical mixture of hydrofluoric acid and ethanol or acetic acid.

15. The method of claim 13, wherein forming the porous area comprises forming a double porosity structure including a first porous area in the semiconductor body which has a first porosity and a second porous area deeper within the semiconductor body which has a second porosity, wherein the first porosity is smaller than the second porosity.

16. The method of claim 15, wherein the porosity of the first porous area is set in a range between 10% and 50% and the porosity of the second porous area is set in a range between the porosity of the first porous area and 80%.

* * * * *

UNITED STATES PATENT AND TRADEMARK OFFICE
CERTIFICATE OF CORRECTION

| | | |
|---|---|---|
| PATENT NO. | : 8,883,612 B2 | Page 1 of 1 |
| APPLICATION NO. | : 13/229861 | |
| DATED | : November 11, 2014 | |
| INVENTOR(S) | : H. Schulze et al. | |

It is certified that error appears in the above-identified patent and that said Letters Patent is hereby corrected as shown below:

In the Claims

At column 6, line 64 of the printed patent, please insert -- of -- before claim.

Signed and Sealed this
Seventeenth Day of March, 2015

Michelle K. Lee
*Director of the United States Patent and Trademark Office*